United States Patent
Schabes et al.

(10) Patent No.: US 10,361,359 B1
(45) Date of Patent: Jul. 23, 2019

(54) MAGNETIC RANDOM ACCESS MEMORY WITH REDUCED INTERNAL OPERATING TEMPERATURE RANGE

(71) Applicant: Spin Memory, Inc., Fremont, CA (US)

(72) Inventors: Manfred Ernst Schabes, Saratoga, CA (US); Thomas D. Boone, San Carlos, CA (US); Mustafa Pinarbasi, Morgan Hill, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,455

(22) Filed: Dec. 30, 2017

(51) Int. Cl.
| | |
|---|---|
| *G11C 11/00* | (2006.01) |
| *H01L 43/02* | (2006.01) |
| *H01L 43/08* | (2006.01) |
| *H01L 43/12* | (2006.01) |
| *G11C 11/16* | (2006.01) |
| *H01L 27/22* | (2006.01) |
| *H01F 10/32* | (2006.01) |

(52) U.S. Cl.
CPC .......... *H01L 43/02* (2013.01); *G11C 11/161* (2013.01); *H01L 27/222* (2013.01); *H01L 43/08* (2013.01); *H01L 43/12* (2013.01); *H01F 10/329* (2013.01); *H01F 10/3286* (2013.01)

(58) Field of Classification Search
CPC ..... G11C 11/161; H01L 43/02; H01L 27/222; H01L 43/08; H01L 43/12; H01F 10/3286; H01F 10/329
USPC ....... 365/48, 55, 62, 66, 74, 78, 80–93, 100, 365/130, 131, 148, 158, 171–173, 209, 365/213, 225.5, 230.07, 232, 243.5
See application file for complete search history.

(56) References Cited

U.S. PATENT DOCUMENTS

| | | | |
|---|---|---|---|
| 7,932,513 B2 * | 4/2011 | Hosotani ................ | B82Y 10/00 257/295 |
| 8,208,295 B2 * | 6/2012 | Dieny ................... | B82Y 25/00 365/158 |
| 2008/0225577 A1 * | 9/2008 | Hosotani ................ | B82Y 10/00 365/158 |
| 2014/0056061 A1 * | 2/2014 | Khvalkovskiy ......... | H01L 43/02 365/158 |

* cited by examiner

*Primary Examiner* — Harry W Byrne
(74) *Attorney, Agent, or Firm* — Zilka-Kotab, P.C.

(57) ABSTRACT

A Magnetic Random Access Memory apparatus device having a memory element formed as a magnetic tunnel junction (MTJ) pillar and having a heating element for maintaining a desired minimum temperature of the memory element. The heating element is separated from the memory element by a thin, non-magnetic, electrically insulating wall, which can be constructed of alumina. The heating element is connected with circuitry that controllably delivers electrical current to the heating element to maintain a desired minimum temperature of the memory element.

21 Claims, 19 Drawing Sheets

MAGNETIC RANDOM ACCESS MEMORY WITH REDUCED INTERNAL OPERATING TEMPERATURE RANGE

FIELD OF THE INVENTION

The present invention relates to magnetic random access memory and more particularly to a magnetic random access memory structure having magnetic tunnel junction memory cells with heating elements to reduce the internal operating temperature range thereby improving the performance for increased user operating temperature range.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a magnetic memory device having a data memory element with a heating element adjacent to the data memory element. A non-magnetic, electrically insulating layer is located between the heating element and the data memory element.

The memory element can be a magnetic tunnel junction (MTJ) element, which can be formed in the shape of a pillar. The heating element and non-magnetic, electrically insulating wall can be formed to wrap around the magnetic memory element pillar, such that each of the non-magnetic, electrically insulating wall and the heating element are concentric with the memory element and such that the non-magnetic, electrically insulating wall is formed as a thin layer that is located between the memory element and the heating element.

The memory element may use different thermal conductances between the heater element and different layers of the MTJ by means of additional structures that are formed laterally between the heater and certain layers of the MTJ.

The memory element may use a heating element that heats a free layer of the MTJ, or a PSC layer of the MTJ, or a combination of freelayer and PSC at different rates than the reference layer.

The heating element advantageously decreases the internal temperature range over which the memory element must be designed to function. Thereby the heating element advantageously increases the environmental temperature range over which a memory element can operate (the "user operating temperature range"). Memory devices such as Magnetic Random Access Memory (MRAM) devices must be able to operate over a wide range of environmental temperatures and with cold startup temperatures. While a magnetic memory element can be designed to operate well at a given temperature, it is difficult to create a memory element that can operate optimally at both high and low temperatures.

The presence of the heating element advantageously raises the lower end of the temperature range over which the memory element must operate, thereby reducing the overall range over which the device must operate. The memory element and heating element can be connected with circuitry that can independently operate the heating element to control temperature, while also operating the memory element to read and write data to and from the memory element.

Temperature monitoring can be performed by using the memory element itself as a temperature sensor. The TMR effect of an MTJ device increases with decreasing temperature. Therefore, by measuring the TMR effect of the memory element, a relative temperature can be determined. This relative temperature can be compared with a reference value in order to maintain a desired temperature in the memory element.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
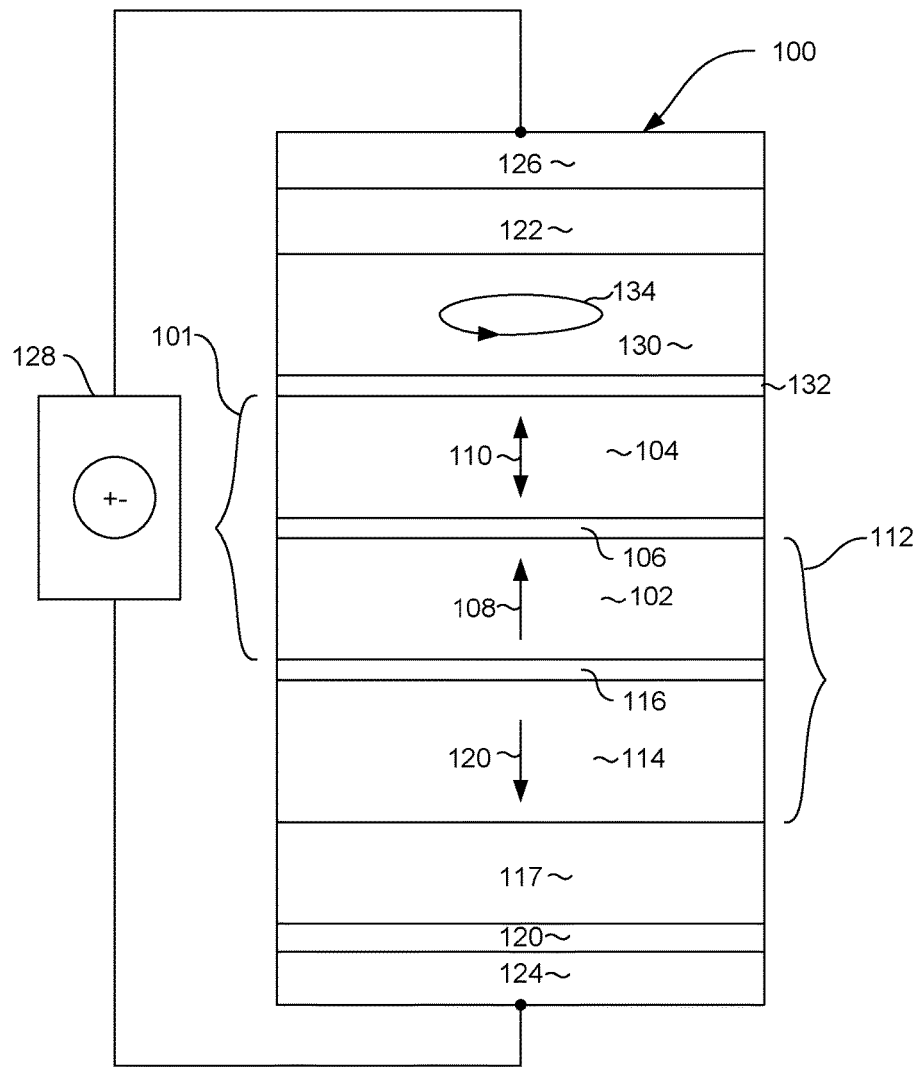
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. Optionally, the keeper layer 114 can be exchange coupled with a layer of antiferromagnetic material such as IrMn 117.

Exchange coupling between the layer of antiferromagnetic material 117 and the keeper layer 114 strongly pins the magnetization 118 of the keeper layer in a first direction. The antiparallel coupling between the layers 114, 102 pins the magnetization 108 of the reference layer 102 in a second direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Au or Cu and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in an upward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in a downward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons will not be able to pass through the barrier layer 106. As a result, the electrons (which have been spin polarized by the magnetization 110 of the free layer 104, will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by a spin-polarizer coupling layer 132. The spin polarization layer 130 has a magnetic anisotropy that causes it to have a magnetization 134 with a primary component oriented in the inplane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

The performance and reliability of a magnetic tunnel junction element, such as the element 100 described above is affected by the temperature at which the element operates. In order to function effectively in a necessary range of application, such as in the "internet of things", cell phones, automotive applications, etc., Magnetic Random Access Memory (MRAM) systems must operate at a wide range of temperatures. Cold start capability is one necessary requirement for such MRAM systems. As an example of the temperature range over which such system must operate, they preferably would be able to effectively operate at −50 degrees C., at room temperature, and also at 120 to 150 degrees C., depending on the application in which the device is used. While a memory element can be constructed to operate efficiently and reliably at a given temperature requirement, constructing the element to work over a broad range of temperatures presents challenges. For example, if the memory element is constructed such that it is capable of operating at a high temperature (e.g. 150 degrees C.), this element may not work as effectively at low temperatures (e.g. −50 degrees C.). Providing sufficient energy barriers for the high temperature operation may make it difficult to write data at low temperatures because of excessive barrier heights. The present invention overcomes this challenge. By incorporating a heating element into the structure of the memory element, the lower end of the internal operating temperature range can be raised, thereby decreasing the internal temperature range over which the device must operate.

Figure 2:
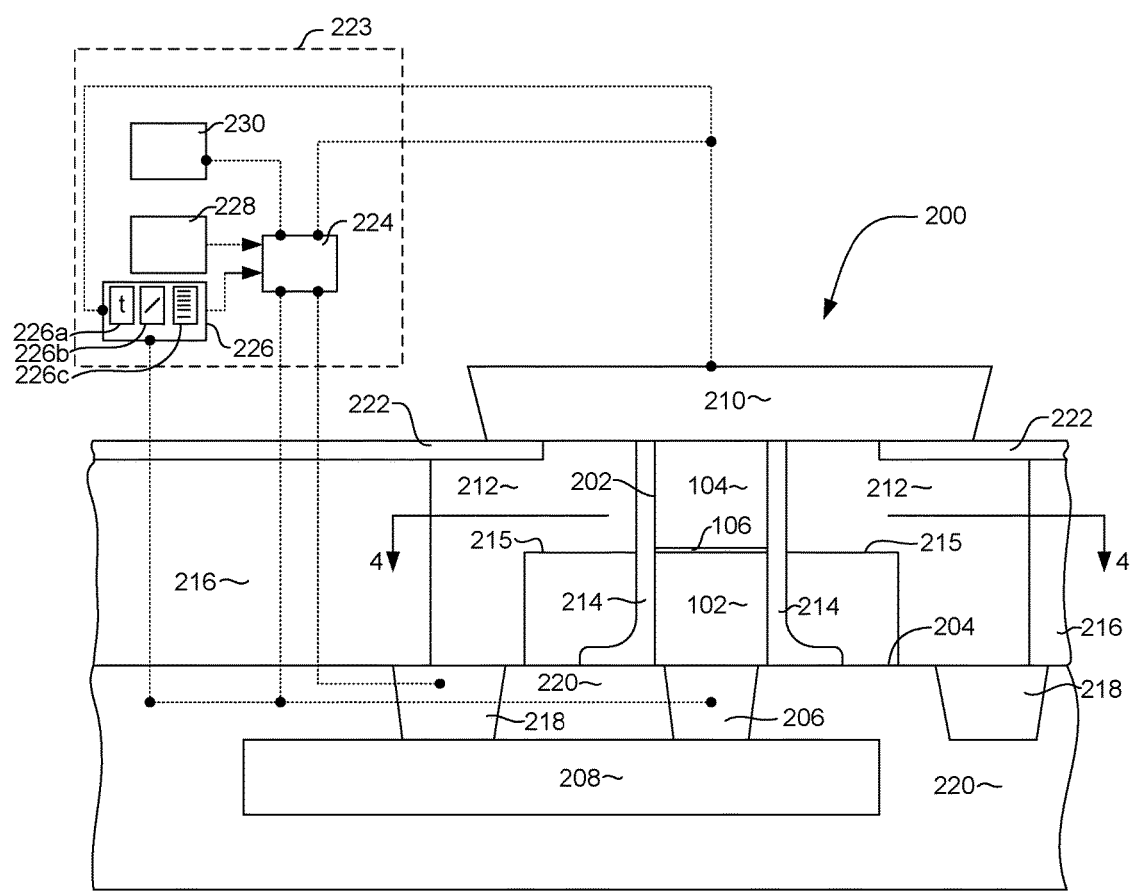
FIG. 2 is a schematic illustration of a magnetic memory element according to an embodiment having a heating structure and showing circuitry for operating the memory cell and heating structure.

FIG. 2 shows a side, cross-sectional schematic view of a Magnetic Random Access Memory (MRAM) device 200 according to an exemplary embodiment of the invention. The MRAM device 200 can include a magnetic memory element 202 that can be a magnetic tunnel junction (MTJ) structure such as the element 100 described above with reference to FIG. 1. However, this is by way of example only, as any of various types of magnetic elements 202 could be used an MRAM system of the present invention. The memory element 202 is formed on a substrate 204 that can include an electrical contact 206 that electrically connects the memory element 202 with circuitry 208 (such as CMOS circuitry) which can be embedded within the substrate 204 on which the element 202 is formed. An upper electrical contact 210 is formed over the memory element so that electrical current and resistance measurements across the memory element provide data reading and writing functions as will be described in greater detail herein below.

The memory element 202 is surrounded by an electrically conductive heating element 212. However, the heating element 212 is separated from the memory element 202 by a thin insulating wall 214, which is disposed between the memory element 202 and the heating element 212. The memory element 202 has an outer wall that can be in contact with the insulating layer 214. The electrically insulating layer 214 can be constructed of a material such as alumina ($Al_2O_3$), which can be deposited by a conformal deposition process as will be seen. The heating element 212 can be a material such as Cu, Ta, Cr, W, or alloys thereof.

The lateral thickness of the heater is chosen such that it forms an electrically conducting path from the electrical contact 218 (Via 1) to the top contact 210 as will be evident from the drawings.

Figure 4:
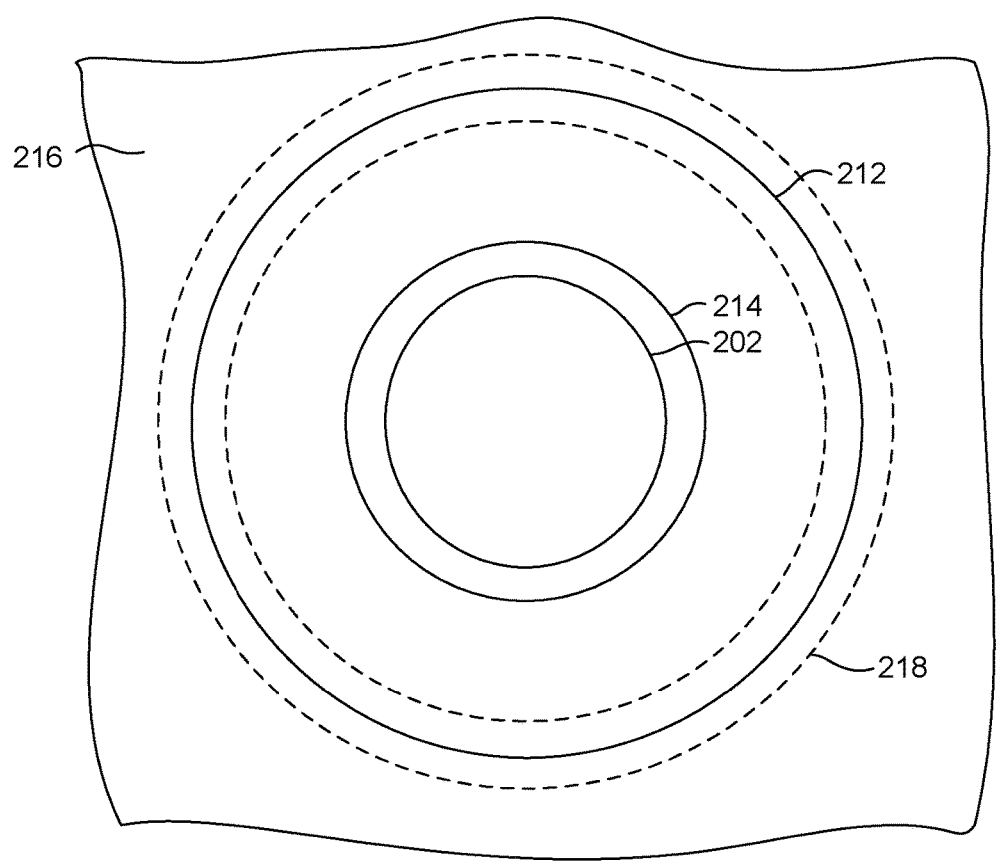
FIG. 4 is a top down view of the magnetic memory element and heating structure as seen from line 4-4 of FIG. 3.

The shape of the memory element 202, insulating wall 214 and heating element 212 can be more clearly understood with reference to FIG. 4, which shows a top down sectional view as seen from line 4-4 of FIG. 2. In FIG. 4 it can be seen that the memory element 202 can have a round or semi-round cross-section such that it is formed as a cylindrical or semi-cylindrical shape. The insulating wall 214 surrounds the memory element 202 and the heating element 212 surrounds the memory element 202 and the insulating wall 214. Therefore, the insulating wall 214 can have the shape of a hollow cylinder that is substantially concentric with the cylinder defined by the memory element 202. Likewise, the heating element 212 can also be formed as a hollow cylinder that is concentric with the memory element 202 and insulting wall 214. However, this is not a requirement, and the heating element 212 could have some other shape. As seen in FIGS. 2 and 4, the areas laterally outside of the memory element 202, insulating wall 214 and heating element 212 can be filled with a non-magnetic, electrically insulating fill layer such as alumina 216.

The heating element 212 can be electrically connected at one end (i.e. the bottom end) with the lower electrical contact 218. The lower electrical contact 218 can be formed co-planar with the first lower electrical contact 206, but does not make direct electrical contact with the magnetic memory element 202. The electrical contact 218 can be formed at one side of the heating element 212, or could be formed as a torus that wraps around to make contact with the entire periphery of the heating element 212. Such a torus shaped electrical contact 218 is shown in dashed line in FIG. 4, so as to indicate that it is hidden beneath the other structures 202, 214, 212, 216 shown in FIG. 4. Areas laterally outside of the contacts 218, 206 can be filled with an electrically insulating fill layer such as alumina or SiN to insulate the contacts 218, 206. The heating element 212 can also be electrically connected with the upper electrical contact 210 so that electrical current can flow through the heating element between contacts 218, 210. It can be seen that, while the memory element 202 and the heating element share the same upper electrical contact 210 at one end, they are connected with separate distinct electrical elements 218, 216 at the lower end opposite the upper heating element 210. An upper insulating cap layer 222 can be provided at the top of the structure to provide electrical insulating and protection. However, the insulating cap layer 222 has an opening which allows electrical contact between the upper electrical connection between the memory upper electrical contact 210 and the memory element 202 and heating element 212.

The structure may also include a second insulator structure 215 which is formed in between the heater element and the memory element 202. Insulator 215 is constructed of a material such as alumina ($Al_2O_3$), which can be deposited by a conformal deposition process as will be seen. The vertical height of insulator 215 generally extends to the top of the reference layer structure 102 in order to reduce the heat flow into the reference layer structures as is generally advantageous for the stability of the reference layer structures 102. However, other heights of insulator 215 are possible. For instance, insulator 215 may extend to the bottom of the free layer. The height of insulator 215 is chosen depending on application and on desired heat flow into the reference layer and into the structures above the reference layer.

The lateral thickness of insulator 215 extends from the memory element 202 towards the electrical contact 218 (Via 1) and may generally cover (on the proximal side of the memory element 202) 10% to 100% of the spacing between memory element 202 and electrical contact 218 (Via 1) depending on desired insulation of the reference layer structures 212 against heat flow. There may also be embodiments where the lateral thickness of the insulator 215 may be relatively thin and only on the order of 3 to 20 nm independent of the spacing of the memory element relative to the electrical contact 218.

With continued reference to FIG. 2, the control of the memory element 202 and heating element can be provided by circuitry 223. The circuitry 223 can be entirely or partially incorporated in the circuitry 208 (e.g. CMOS) or could be entirely separate from the circuitry 208. For purposes of explanation of the use of circuitry 223 to control and operate the memory element 202 and heating element 212, the electrical contact 218 will be referred to herein as a first terminal, electrical contact 206 will be referred to herein as a second terminal, and electrical contact 210 will be referred to herein as the third terminal.

The circuitry 223 can include: control circuitry 224, a data processing engine 230; and temperature control circuitry 228. The control circuitry 224 controls electrical current flow through the memory element 202 and also through the heater element 212. This control of current flow through the heater memory element 202 and heater element 212 can include three basic modes of operation. First, in a data write operation electrical current is delivered to the memory element through the second and third electrical contacts 206 and 210. Similarly, in a read operation a much smaller electrical current is delivered between the second and third electrical contacts 206, 210 in order to measure the voltage/resistance across the memory element 202 between the second and third electrical contacts 206, 210. In a heating operation, the control circuitry 224 delivers electrical current between the first and third electrical contacts 218, 210 in order to supply heating electrical current through the heater element 212.

The control circuitry 224 can communicate with the data processing engine 230 so that the data processing engine can optimize and condition the data. The data processing engine 230 can include circuitry for providing functions such as error correction control (ECC) other signal processing calculations and circuitry.

Temperature control circuitry 228 provides signal information regarding the temperature of the memory element 202 to the control circuitry 224 so that the control circuitry can accurately provide a desired amount of current to the first and second electrical contacts 218, 210 in order to provide the desired amount of heating by the heating element 212. The temperature control circuitry 228 can determine the current temperature of the memory element at any point in time by receiving a signal from a temperature sensor (not shown). Or, alternatively, the temperature control circuitry can measure the temperature of the memory element 202 directly from the memory element itself, using the memory element 202 as a temperature sensor. The TMR effect (change in electrical resistance) of a magnetic tunnel junction (TMR) device decreases predictably as the temperature of the device 202 increases. A reference resistance/temperature value 226a can be established together with a slope dTMR/dT 226b, such as during an initialization process that is established during a calibration process. Other embodiments may utilize, for example, a lookup table 206c that can be created during the calibration procedure containing TMR values at multiple temperatures thereby enabling suitable interpolation between these values at intermediate temperatures. The TMR effect of the memory element 202 can be compared with a value at this reference value in order to determine a relative temperature of the element 202 and to determine an amount of current, if any, the control circuitry 224 should deliver to the heating element 212 via first and second contacts 218, 210.

The operation of the PSC may have a different temperature dependence than the temperature dependence of the TMR. Interfacing the heater with the operation of the PSC may use additional calibration procedures, including measuring the switching current as a function of the temperature; or of measuring the switching speed as a function of temperature. Depending on application (e.g. whether TMR, switching current, or switching speed is top priority) different calibration procedures may be used. Or in some embodiments, multiple lookup tables may be used, and the control of the heater may use one lookup table (e.g. TMR(T)) in one temperature interval while using another lookup table (e.g. switching speed (T)) in another temperature interval.

Figure 3:
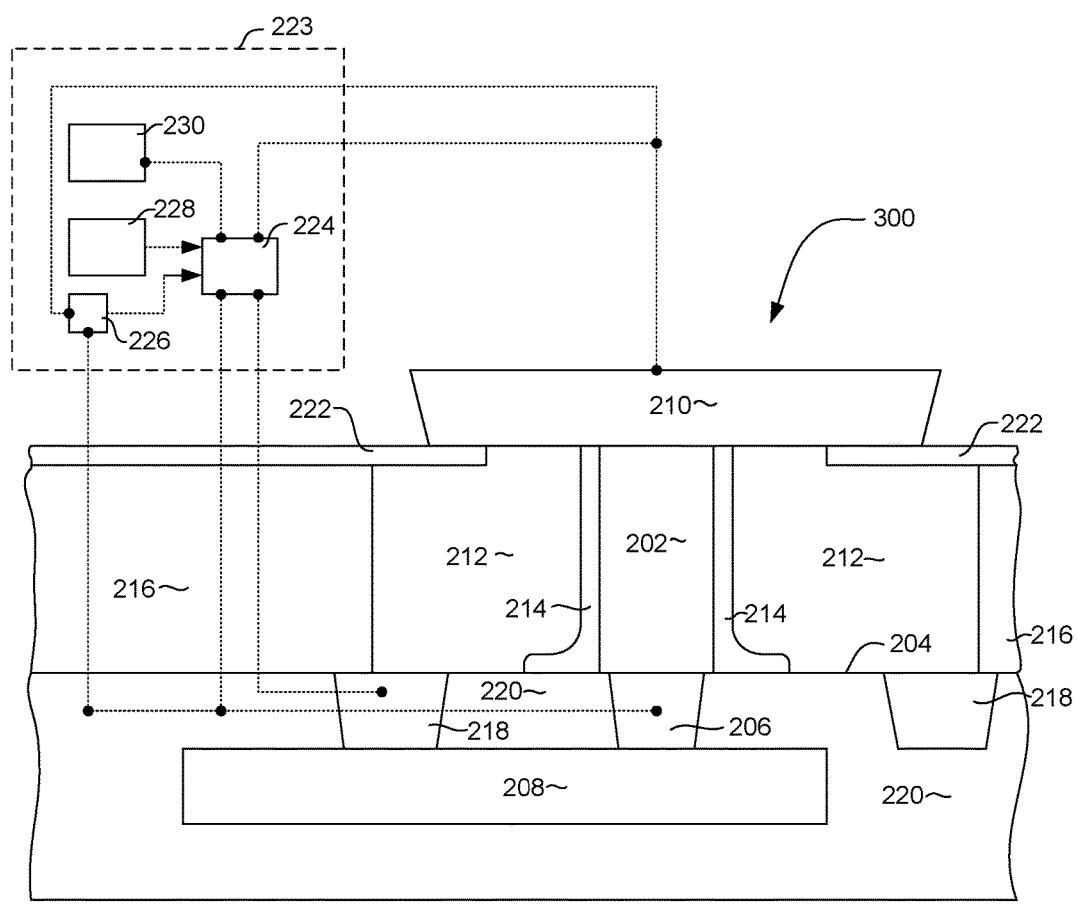
FIG. 3 is a schematic illustration of a magnetic memory element according to another embodiment having a heating structure and having additional thermal insulation to protect the reference layer from being heated by the heating element.

FIG. 3 shows a cross-sectional schematic view of a magnetic random access memory structure 300 according to an alternate embodiment of the invention. The memory structure 300 is similar to the memory structure 200 of FIG. 2, except that in the structure 300 of FIG. 3, the second insulation structure 215 (FIG. 2) is removed. This type of structure may be beneficial where heating of the reference layer is not an issue and where further simplicity of manufacture and space savings are more of a priority.

Figure 5:
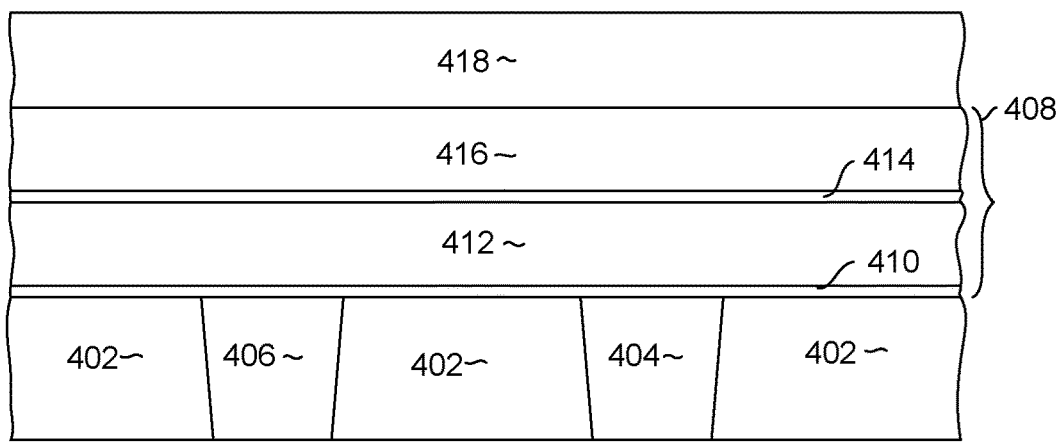
FIGS. 5-18 are views of a wafer in various intermediate stages of manufacture, illustrating a method for manufacturing a magnetic data element structure having a heating element.

FIGS. 5-18, show a wafer in various intermediate stages of manufacture in order to illustrate a method for manufacturing a magnetic random access memory structure having a heater element according to an embodiment of the invention. With reference to FIG. 5, a substrate 402 is formed, having a planar surface and having first and second electrical leads 406, 404 (via) formed therein. Although not shown in FIG. 5, the lead 406 can be formed as a torus shape as described above with reference to the electrical lead 218 of FIGS. 2, 3 and 4. A seed layer 410 can be deposited over the substrate 402, 404 and series of memory element layers 408 are deposited over the seed layer 410. The series memory element layers 408 can include a magnetic reference layer 412, a non-magnetic barrier layer 414 and a magnetic free layer 416. The series of memory element layers 408 may also include other layers as well. However, these are not shown in FIG. 5. A hard mask structure 418 is then deposited over the memory element layers 408. The hard mask structure is preferably a material that is resistant to ion milling, such as alumina ($Al_2O_3$) or carbon.

Figure 6:
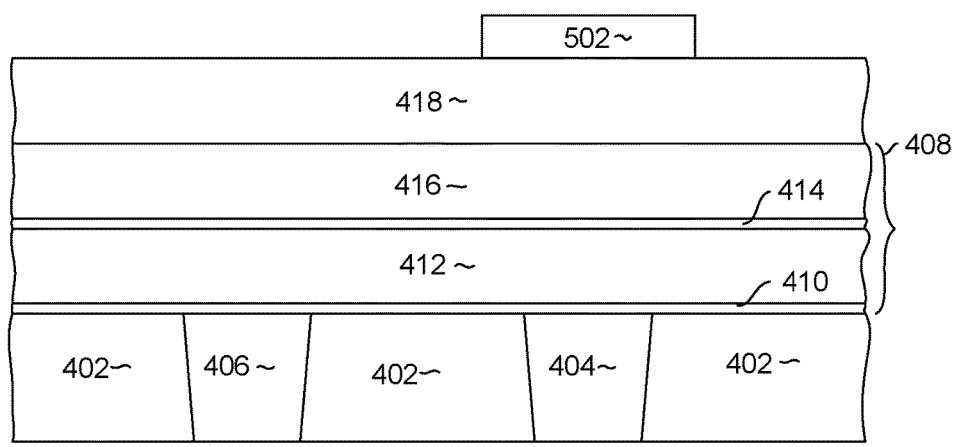

With reference now to FIG. 6, a second hard mask 502 is formed over the first hard mask 418. The second hard mask 502 is patterned so as to form a mask structure that is configured to define a magnetic element pillar in a region over the electrical contact 404. The process for patterning the second hard mask 502 can include: depositing the hard mask material 502 full film; spinning on a photoresist material; photolithographically patterning the photoresist to define a photoresist mask; and performing a reactive ion etching to transfer the image of the photoresist onto the underlying second hard mask layer 502.

Figure 7:
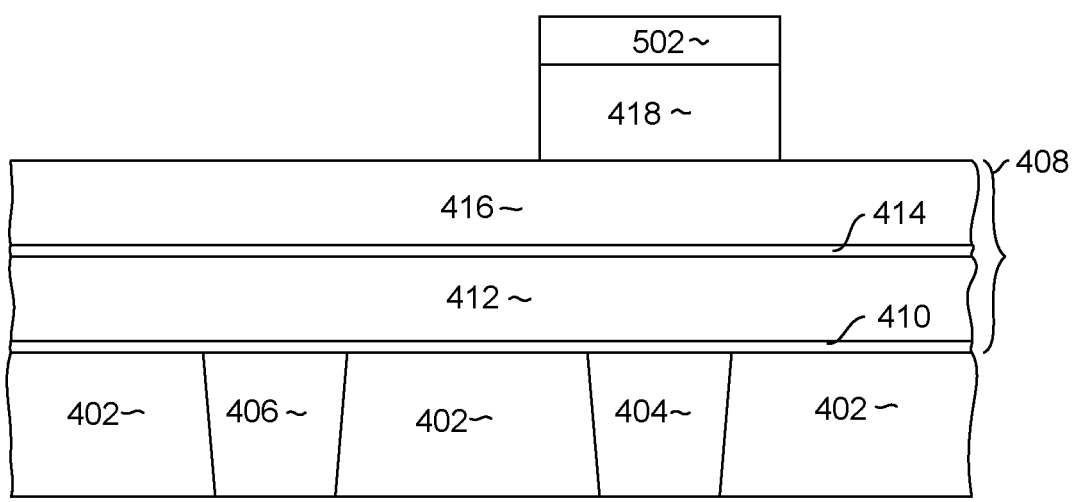

With reference now to FIG. 7, a reactive ion etching can be performed to transfer the image of the second hard mask 502 onto the underlying first hard mask layer 418. This can be performed, for example by performing a reactive ion etching in an atmosphere that is chosen to selectively remove the material of the first mask 418.

Figure 8:
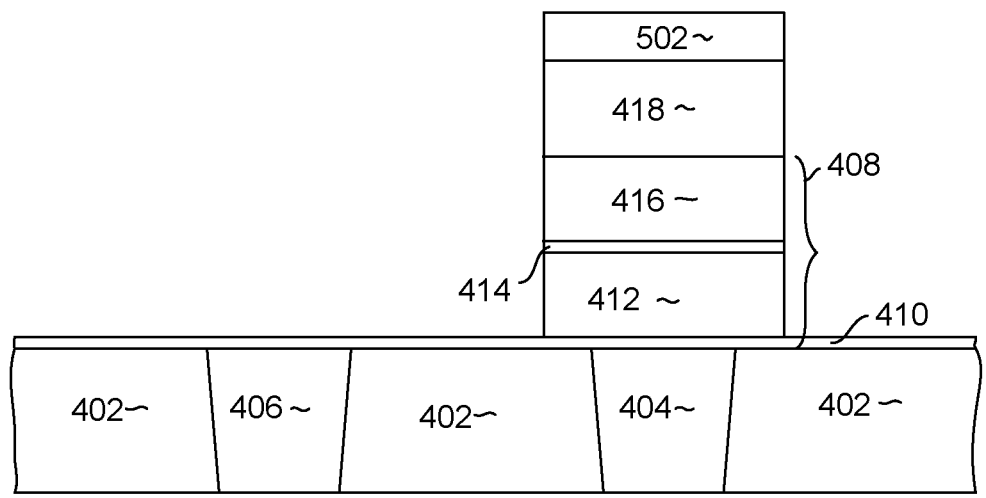

Then, with reference to FIG. 8, a material removal process is performed to remove portions of the magnetic element material 408 that are not protected by the masks 418, 502 in order to transfer the image of the masks 418, 502 onto the underlying magnetic element material so as to form a magnetic element pillar. The material removal process used to remove the magnetic memory element material 408 is preferably an ion milling process.

Figure 9:
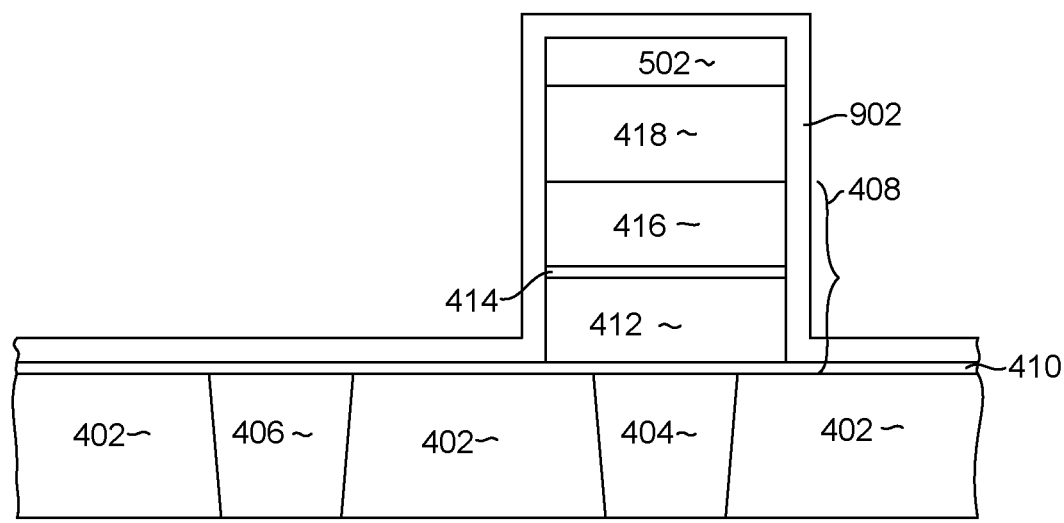
Figure 10:
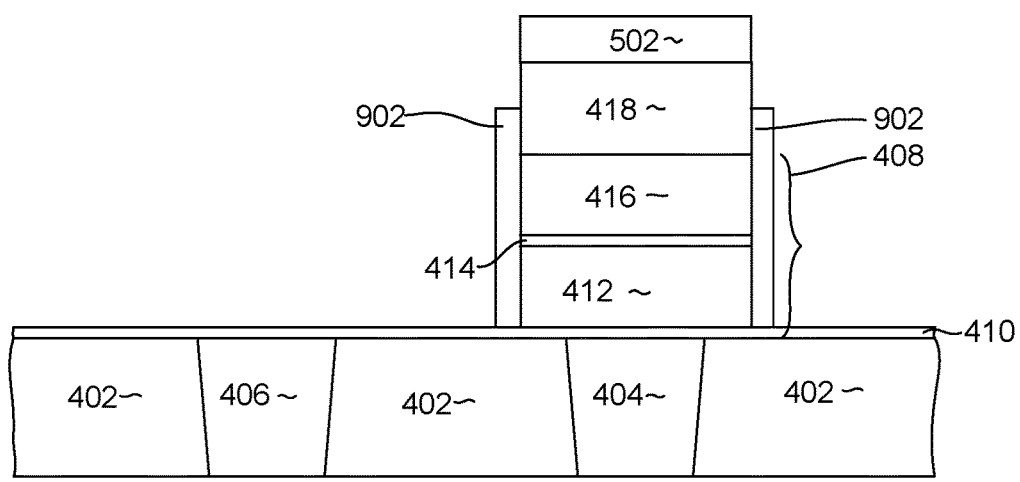

With reference to FIG. 9, a first layer of electrically insulating material 902 is deposited. This layer 902 is preferably deposited by a conformal deposition process such as atomic layer deposition (ALD) or chemical vapor deposition (CVD). This first electrically insulating layer can be alumina or $SiO_2$, and is preferably deposited relatively thin. Then, an etching process such as reactive ion etching is performed to remove a portion of the first insulating material 902, leaving a structure as shown in FIG. 10. The etching process is preferably performed in a manner so as to preferentially remove horizontally disposed portion of the insulating material to leave a vertical side wall of insulating material 902 as shown in FIG. 10.

Figure 11:
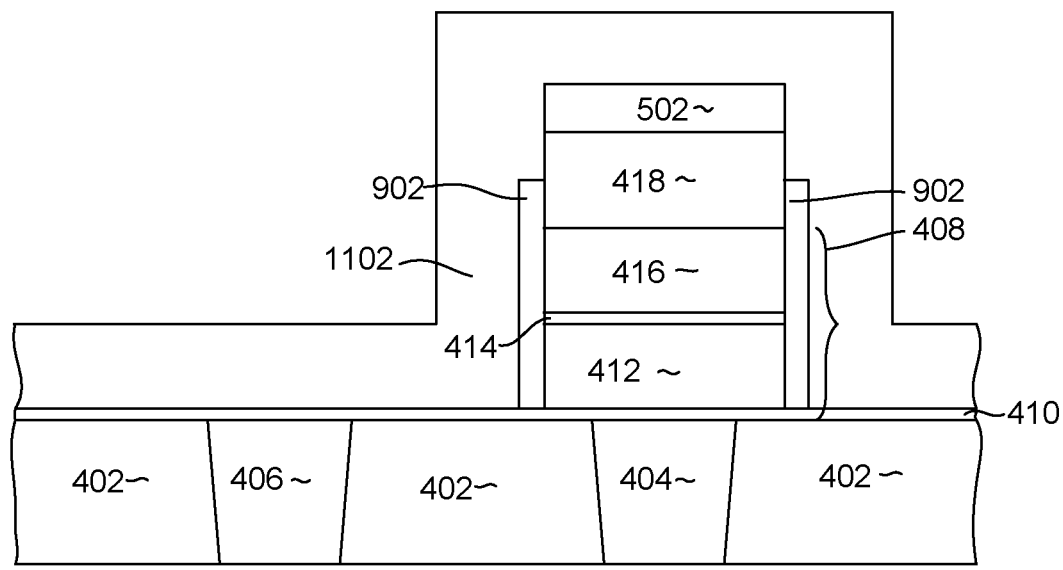

Then, with reference to FIG. 11, a second layer of electrically insulating material 1102 is deposited. The second layer of electrically insulating material 1102 can be deposited thicker than the first layer 902, and is preferably a material that is both a thermal insulator as well as an electrical insulator. For example, the second insulation layer can be constructed of alumina ($Al_2O_3$). The second insulation layer is deposited to a thickness that will define a desired height of a second insulation layer structure. Preferably, the second insulation layer 1102 is deposited to a thickness that is at least equal to the level of the top of the reference layer 412 or to the level of the barrier layer 414.

Figure 12:
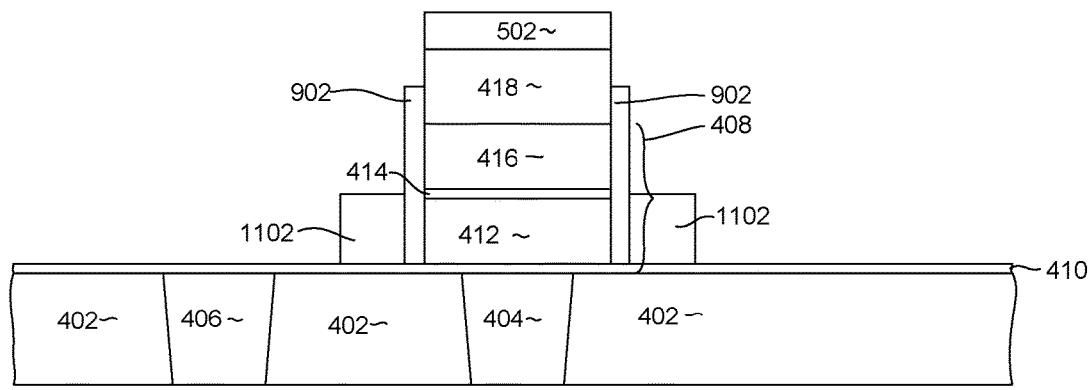

Then, a second etching process is performed to remove a portion of the second insulation layer 1102, leaving a structure as shown in FIG. 12. The etching process, which can be a reactive ion etching process is performed in a manner to leave an insulation structure at the base of the first insulation layer 408, wherein the second insulation layer preferably extends to the height of the top of the reference layer 412 or barrier layer 416. For example, the reactive ion etching can be performed in such a manner that takes advantage of shadowing effects from the structures 408, 418, 502 to form the second insulation structure 1102 shown in FIG. 12. Also, although shown as a rectangular shape in FIG. 12, the resulting second insulation structure 1102 may actually have a rounded shape or rounded corner.

Figure 13:
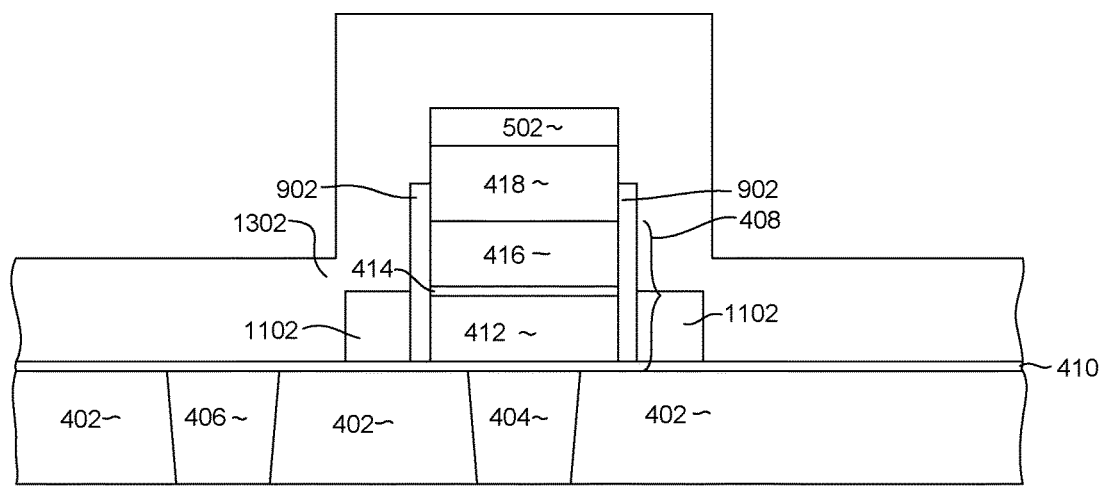
Figure 14:
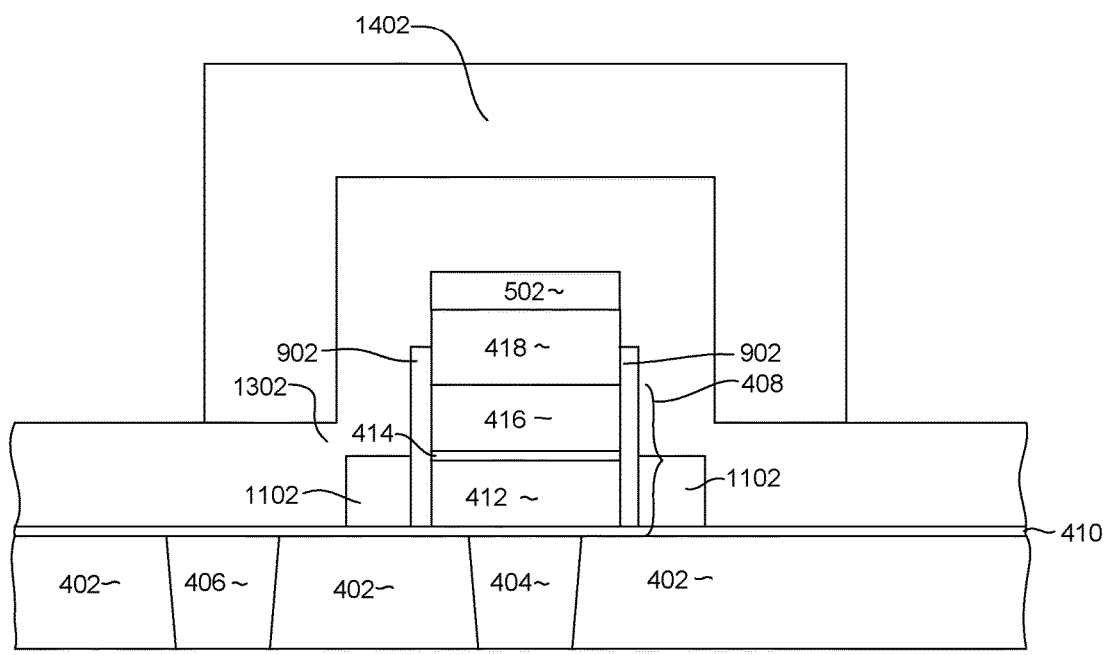
Figure 15:
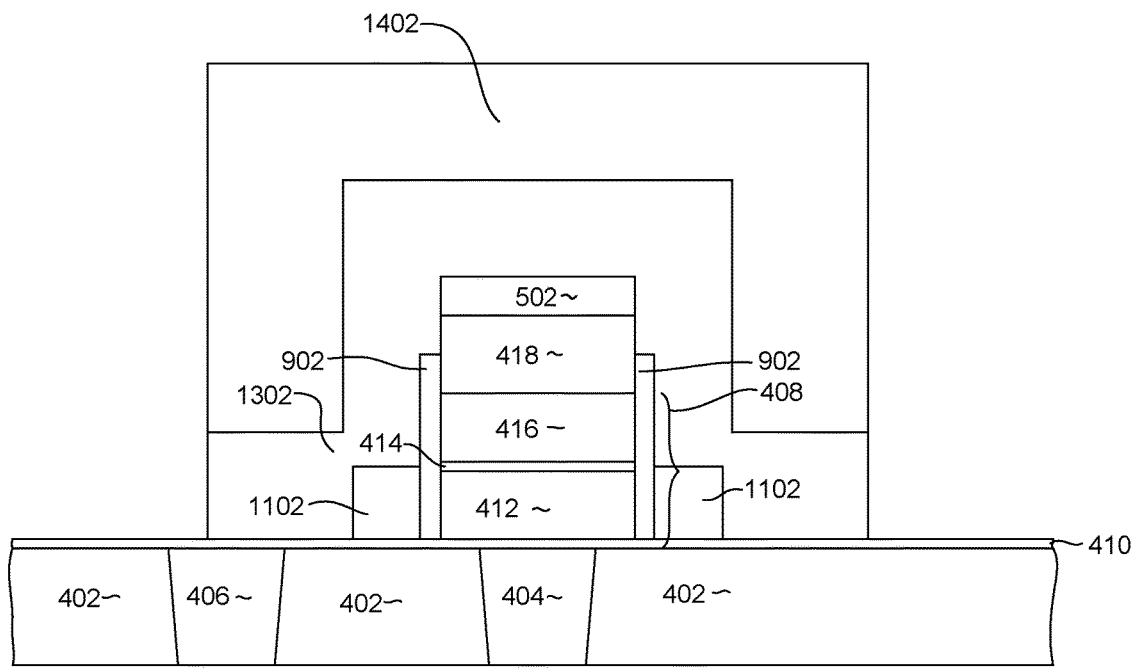

With reference now to FIG. 13, a layer of heater material 1302 is deposited. The heater material 1302 is preferably a metal, and be a metal such as Cu, Ta, Cr, W, or alloys thereof. Then, with reference to FIG. 14, a heater element defining photoresist mask 1402 is formed over the heater material 1302. The photoresist mask 1402 is patterned to have a shape that is configured to have a shape to define a heater element outer dimension. Then, with the photoresist mask 1402 formed, a metal etching process is performed to remove portions of the heater element material 1302 that are not protected by the mask 1402, leaving a structure as shown in FIG. 15. After etching, the photoresist mask 1402 can be removed, such as by a chemical liftoff process.

Figure 16:
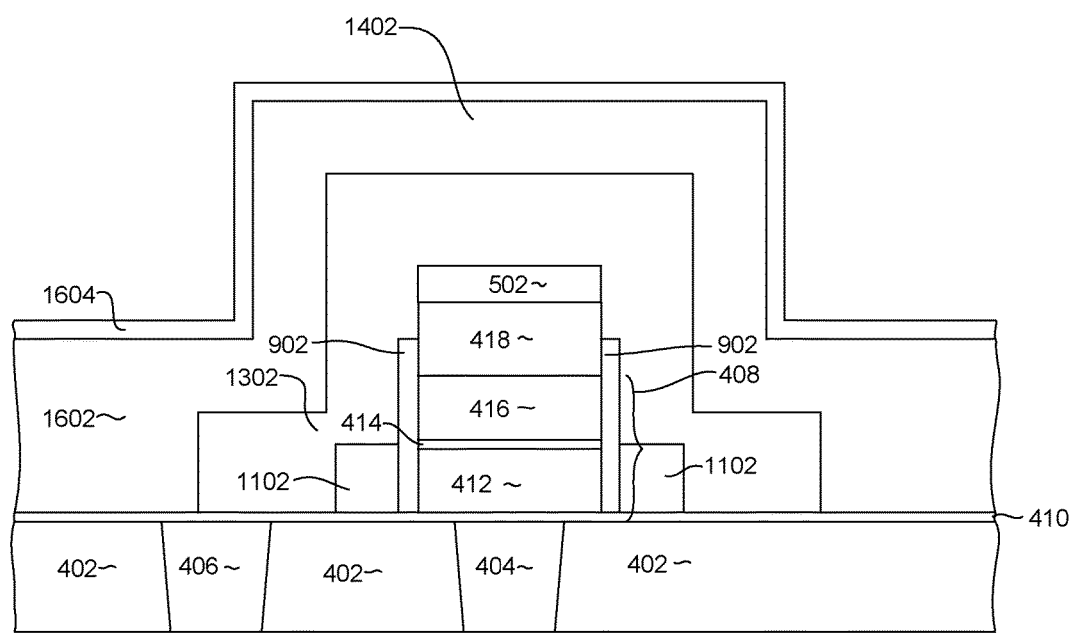
Figure 17:
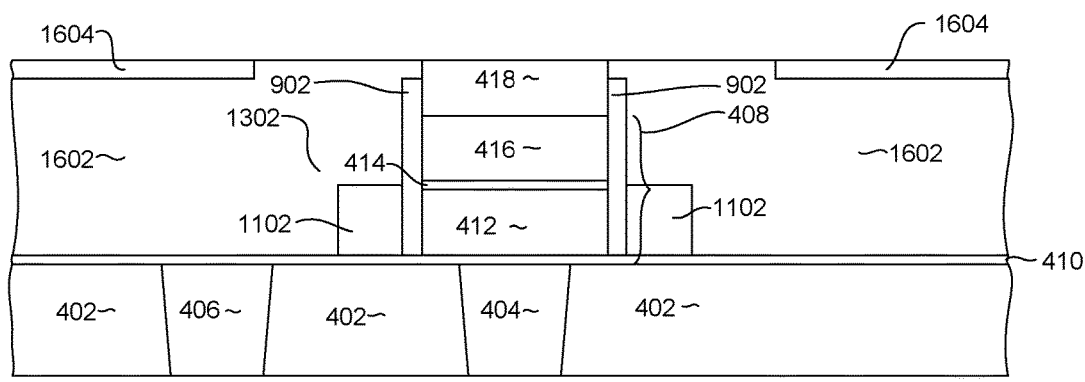
Figure 18:
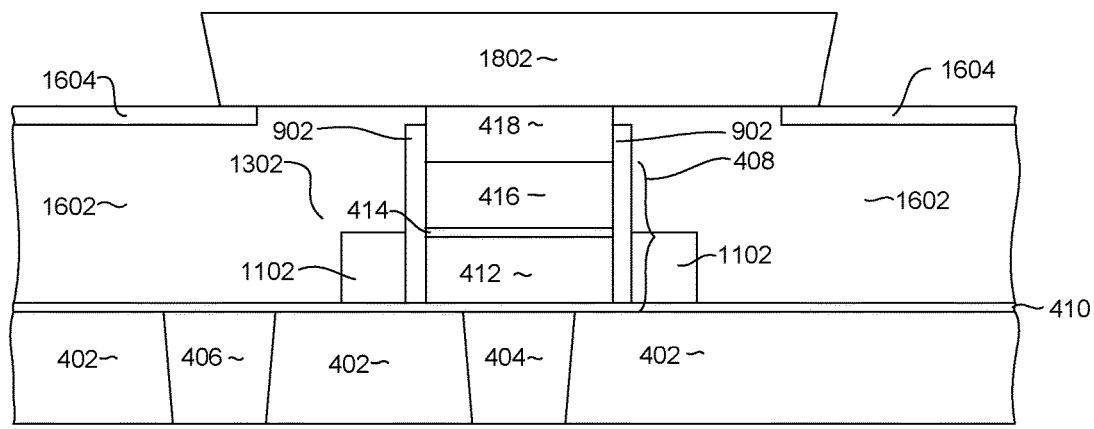

Then, with reference to FIG. 16, an electrically insulating fill layer 1602 such as alumina or $SiO_2$ can be deposited, and a layer of material that is resistant to removal by chemical mechanical polishing (CMP stop endpoint layer) 1604 is deposited over the electrically insulating fill layer 1602. A chemical mechanical polishing process (CMP) can then be performed, leaving a structure as shown in FIG. 17. Then, with reference to FIG. 18, an upper electrical contact 1802 can be formed over the top of the structure. The electrical contact 1802 can be formed of an electrically conductive material such as Cu.

Figure 19:
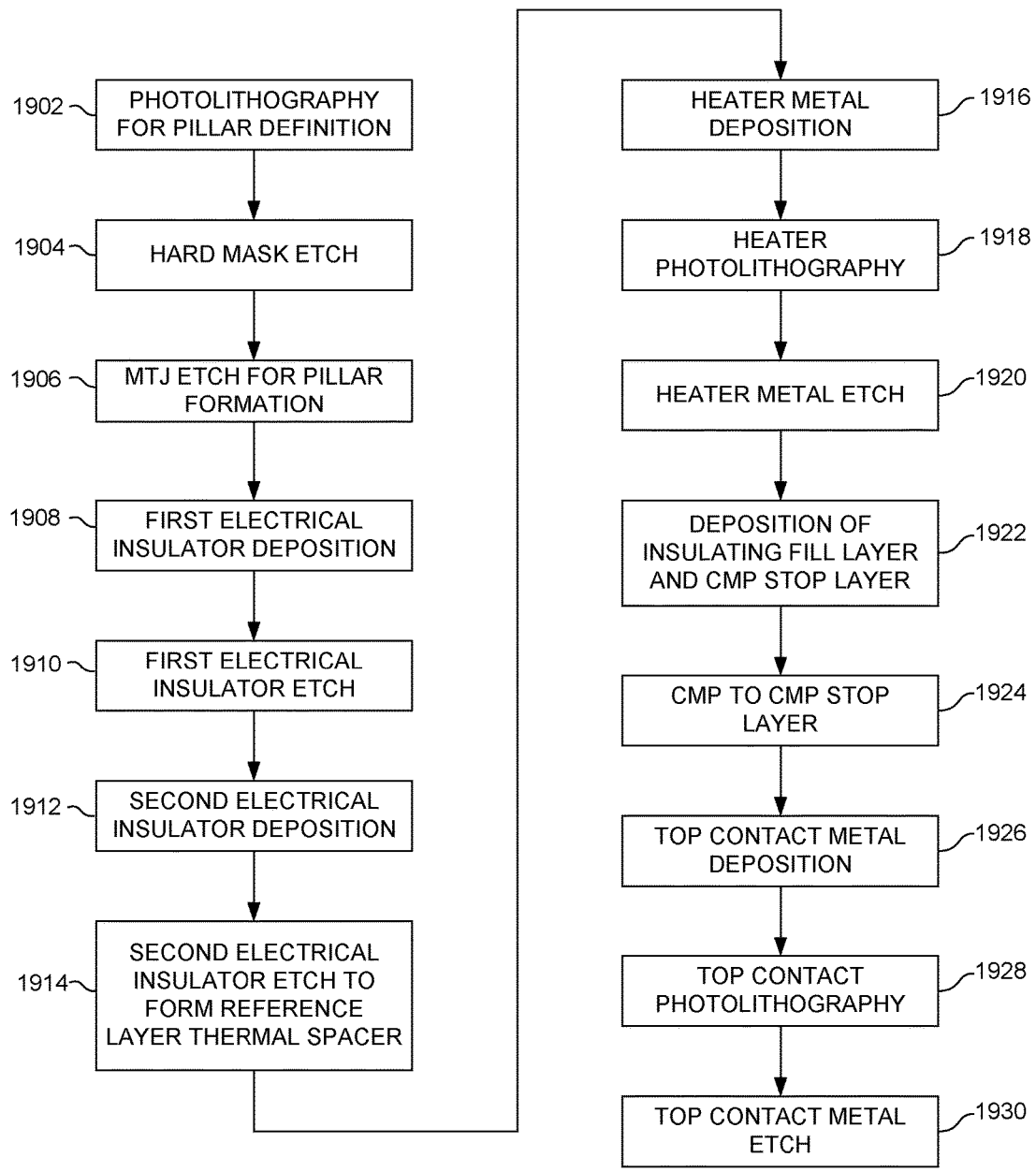
FIG. 19 is a flowchart summarizing the method of manufacturing a magnetic data element having a heating element.

The above described process can also be described with reference to FIG. 19, which shows a flowchart summarizing a process flow for manufacturing a magnetic memory structure according to an embodiment. First, in a step 1902 a photolithographic process to form a memory element defining photoresist mask. Then, in a step 1904, an etching process is performed to transfer the image of the photoresist mask onto an underlying hard mask layer. In a step 1906, a material removal process such as ion milling is performed to remove portion of memory element material that are not protected by the hard mask to define a magnetic memory element pillar. The material removal process used to define the memory element pillar can be an ion milling process.

Then, in a step 1908, a first layer of electrically insulating material is deposited. This first insulation layer can be alumina or $SiO_2$ and can be deposited by atomic layer deposition or chemical vapor deposition. Then, in a step 1910 a first insulator etch (such as reactive ion etching) is performed to remove a portion of the first insulation layer, leaving insulating side walls on the side of the memory element pillar.

In a step 1912, a second layer of electrically insulating material is deposited. Then, in a step 1914, a second insulator etching process is performed to remove a portion of the second, electrically insulating material, thereby forming thermal insulation structures at the base of the first insulator sidewall structure.

In a step 1916, a heater metal is deposited. The heater metal can be a material such as Cu, Ta, Cr, W, or alloys thereof. The heater metal can be deposited, for example, by electroplating or sputter deposition. Then, in a step 1918, a photoresist mask is formed over the heater metal, the photoresist mask being patterned to define an outer edge of the heater element. Then, in a step 1920, an etching process is performed to define the heater element, and the photoresist mask can then be removed.

In a step 1922, an electrically insulating fill layer is deposited followed by a chemical mechanical polishing (CMP) endpoint layer. The insulating fill layer can be a material such as alumina, and the CMP endpoint layer can be a material having a high resistance to remove by CMP, such as carbon.

Then, in a step 1924, a chemical mechanical polishing process (CMP) is performed. The CMP process removes portion of the structure that extend upward over the memory element and is stopped at when the CMP endpoint layer in the field region has been reached.

Then, in a step 1926, a top electrical contact metal is deposited. The top electrical contact metal can be Cu and can be deposited by electroplating or sputter deposition. In a step 1928, a photolithographic process is performed to form a top contact defining mask. Finally, in a step 1930, an etching process is performed to remove portions of the electrical contact metal that are not protected by the top contact defining mask, thereby defining an upper contact that is electrically connected with the heater element and the magnetic memory element pillar.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A magnetic data recording apparatus, comprising:
   a memory element;
   a heating element adjacent to the memory element; and
   a non-magnetic, electrically insulating wall separating the memory element from the heating element.

2. The magnetic data recording apparatus as in claim 1, wherein the memory element is a magnetic tunnel junction structure.

3. The magnetic data recording apparatus as in claim 1, wherein the memory element is a magnetic tunnel junction element that includes a magnetic free layer having a magnetization that can move between either of two opposite orientations, a magnetic reference layer having a fixed magnetization direction and a non-magnetic tunnel barrier layer located between the magnetic free layer and the magnetic reference layer.

4. The magnetic data recording apparatus as in claim 1, wherein:
   the memory element is a magnetic tunnel junction element formed as a pillar; and
   the non-magnetic, electrically insulating wall and the heating element wrap around the memory element.

5. The magnetic data recording apparatus as in claim 1, wherein the non-magnetic, electrically insulating wall comprises alumina.

6. The magnetic data recording apparatus as in claim 1, further comprising:
   a first electrical contact electrically connected with the heating element;
   a second electrical contact electrically connected with the memory element; and
   a third electrical contact electrically connected with both the heating element and the magnetic memory element.

7. The magnetic data recording apparatus as in claim 6, further comprising circuitry electrically connected with the first and third electrical contacts, the circuitry being configured to deliver electrical current to the heating element to maintain a desired minimum temperature.

8. The magnetic data recording apparatus as in claim 6, further comprising:
   circuitry connected with the second and third electrical contacts, the circuitry being functional to determine a relative temperature of the memory element based on a TMR effect value of the magnetic memory element;
   circuitry connected with the first and third electrical contacts the circuitry being functional to controllably deliver electrical current to the heating element based on the determined relative temperature of the memory element in order to maintain a desired minimum temperature of the memory element.

9. The magnetic data recording apparatus as in claim 8, wherein the TMR effect value is compared with a predetermined reference value.

10. The magnetic data recording apparatus as in claim 8, wherein the circuitry that is functional to determine a relative temperature of the memory element based on a TMR effect value of the magnetic memory element accesses a lookup table to determine a relative temperature.

11. The magnetic data recording apparatus as in claim 1, further comprising an insulating structure located between the electrically insulating sidewall and the heating element.

12. The magnetic data recording apparatus as in claim 11 wherein the memory element includes a magnetic reference layer, a magnetic free layer and a non-magnetic barrier layer located between the magnetic reference layer and the magnetic free layer, and wherein the insulating structure is located adjacent to magnetic reference layer.

13. The magnetic data recording apparatus as in claim 12, wherein the insulating structure extends to a height that is substantially equivalent to a height of the magnetic reference layer.

14. The magnetic data recording apparatus as in claim 12, wherein the insulating structure extends substantially from a base of the magnetic memory element to a level that is substantially at a level of the non-magnetic barrier layer.

15. The magnetic data recording apparatus as in claim 11, wherein the insulating structure comprises a material that is both thermally and electrically insulating.

16. The magnetic data recording apparatus as in claim 11, wherein the insulating structure comprises one or more of alumina and $SiO_2$.

17. A method for manufacturing a magnetic data recording apparatus, the method comprising:
   forming a magnetic element pillar;
   depositing a first layer of electrically insulating material;
   performing a first etching process to cause the first layer of electrically insulating material to form an electrically insulating side wall on a side of the magnetic element pillar
   depositing a second electrically insulating material;
   performing a second etching process to form an insulation structure; and
   depositing a heating element material such that the electrically insulating side wall and the insulation structure are between the heating element material and the magnetic element pillar.

18. The method as in claim 17, further comprising, after depositing the heating element material:
   forming a heating element defining mask over the heating element material; and
   performing an etching process to remove portions of the heating element material that are not protected by the heating element defining mask.

19. The method as in claim 18, further comprising, after performing an etching process to remove portions of the heating element material that are not protected by the heating element defining mask:
  depositing an electrically insulating fill layer;
  depositing a chemical mechanical endpoint detection layer over the electrically insulating fill layer; and
  performing a chemical mechanical polishing.

20. The method as in claim 19, further comprising after performing the chemical mechanical polishing, forming an upper electrical contact.

21. The method as in claim 20, wherein the upper electrical contact is formed to be electrically connected with both the heating element material and the magnetic memory element.

\* \* \* \* \*